United States Patent [19]
Mole et al.

[11] Patent Number: 5,248,661
[45] Date of Patent: Sep. 28, 1993

[54] CRYOCONDUCTING-SUPERCONDUCTING COMPOSITES

[75] Inventors: Cecil J. Mole, Monroeville; Alan T. Male, Murrysville Boro; Walter J. Carr, Jr., Wilkins; Clifford K. Jones, Penn Hills, all of Pa.

[73] Assignee: Westinghouse Electric Corp., Pittsburgh, Pa.

[21] Appl. No.: 801,565

[22] Filed: Dec. 2, 1991

[51] Int. Cl.⁵ .................... H01B 12/00; H01L 39/12
[52] U.S. Cl. .......................................... 505/1; 75/234; 75/235; 428/545; 505/785
[58] Field of Search ................ 428/545; 505/1, 785, 505/701; 75/234, 235

[56] References Cited

U.S. PATENT DOCUMENTS

| | | | |
|---|---|---|---|
| 4,109,374 | 8/1978 | Whetstone et al. | 29/599 |
| 4,200,767 | 4/1980 | Nomura et al. | 174/126 S |
| 4,239,606 | 12/1980 | Dowless et al. | 204/67 |
| 4,285,120 | 8/1981 | Nomura et al. | 29/599 |
| 4,863,804 | 9/1989 | Whitlow et al. | 428/555 |
| 4,971,944 | 11/1990 | Charles et al. | 505/1 |
| 4,990,490 | 2/1991 | Pathare et al. | 505/1 |
| 5,063,201 | 11/1991 | Rao et al. | 505/1 |
| 5,132,278 | 7/1992 | Stevens et al. | 501/1 |

OTHER PUBLICATIONS

Jin et al. "High Tc Superconductors Composite Wire Fabrication" *Applied Physics Letter*, vol. 51, No. 3, Jul. 20, 1987, pp. 203 to 204.

"Copper.Brass.Bronze-Wrought Mill Products" *Standards Handbook*, Copper Development Association, p. 11.

*Aluminum Standards and Data 1979*, the Aluminum Association, p. 15.

*Primary Examiner*—Donald P. Walsh
*Assistant Examiner*—Ngoclan T. Mai
*Attorney, Agent, or Firm*—Daniel P. Cillo

[57] ABSTRACT

A ductile, high electrical conductivity composite is made, containing alkaline earth metal-copper oxide particles (14), having a gold coating (16), within a skeletal matrix of hyperconducting aluminum (22) enclosed by a metallic sheath (12).

9 Claims, 1 Drawing Sheet

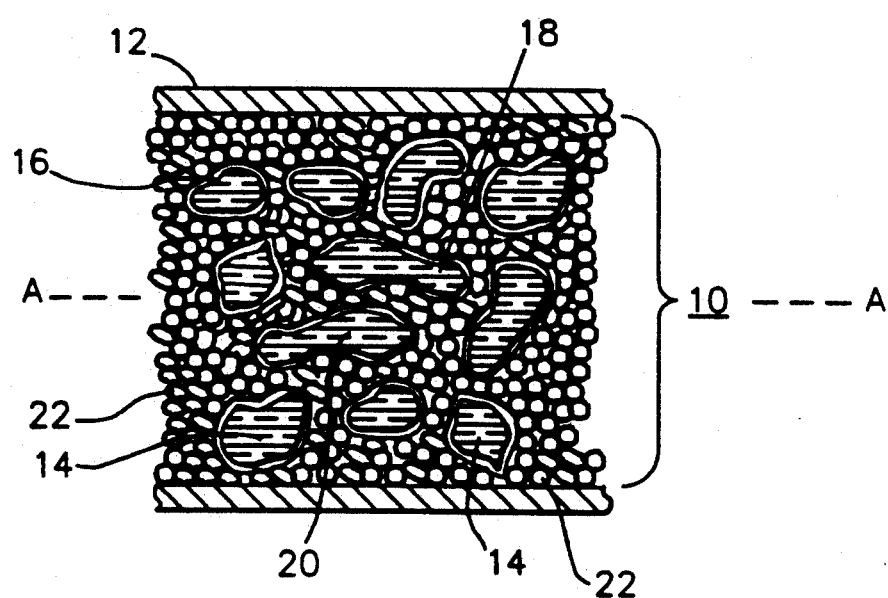

CRYOCONDUCTING-SUPERCONDUCTING COMPOSITES

BACKGROUND OF THE INVENTION

Perovskite related ceramic oxides, comprising, for example, alkaline earth metal-copper oxide, such as orthorhombic yttrium-barium-copper oxide materials, usually characterized as $YBa_2Cu_3O_{7-x}$ or "1:2:3 ceramic oxides", are well-known "high temperature" superconductor materials. This 1:2:3 ceramic oxide material has been found to provide electrical superconductivity, i.e., essentially no electrical resistance, in the region of 93° K.

The 1:2:3 ceramic oxides and other alkaline earth metal-copper oxide based ceramics can operate in the superconducting mode well above the 77° K. boiling point of relatively inexpensive and plentiful liquid nitrogen, and could find increased use in composite windings for high current magnets, energy storage coils, long distance power transmission, and the like. However, 1:2:3 ceramic oxides and other superconducting ceramic oxides are hard and brittle, and by themselves are not easily extruded or otherwise fabricated into fine wire or windings. Additional problems stem from "weak links" formed, for example, by grain boundary contaminant films and non-conducting interparticle films.

As a solution to the brittleness problem, Jin et al. in *Applied Physics Letters*, "High $T_c$ Superconductors-Composite Wire Fabrication", Vol. 51, No. 3, Jul. 20, 1987, pp. 203 to 204, placed a metal cladding around a heat treated 1:2:3 ceramic oxide powder superconducting core. The metal cladding, Ag, or Cu with a Ni/Au oxygen diffusion barrier, allowed ease of drawing into fine wire form, from 0.6 cm to 0.02 cm diameter, and also provided a parallel electrical conduction path in case the ceramic oxide lost its superconducting properties and became a normal conductor. Ag was found particularly advantageous as a cladding, since it could have the dual function of cladding and oxygen diffusion medium. The drawn wires were then annealed at 900° C. and 600° C. in oxygen. Multi-filamentary ribbon composites were also formed. Jin et al. also recognized the problem of oxygen loss from the metal clad 1:2:3 ceramic oxide during sintering, suggesting addition of an oxygen donor to the core, use of a perforated or porous cladding, or the like.

Early efforts to improve ductility while maintaining the high strength of the sheathing for a superconducting core, were made in U.S. Pat. No. 4,863,804 (Whitlow et al.), where $Nb_3Sn$, $Nb_3Al$ or the like were placed in composite sheathing, and a copper or aluminum inner layer was dispersion hardened with from 0.01 wt. % to 1 wt. % of $Al_2O_3$, $ZrO_2$, $SiO_2$, $TiO$, $Y_2O_3$, $Cr_2O_3$, $Th_2O_3$, SiC or BC. Alloys, such as Cu-Nb, Cu-Ta, or Al-Fe were also taught as effective. The highly ductile outer layer could be substantially pure, oxygen free, electrical grade, high conductivity (OFHC) copper, or electrical conductivity grade aluminum. Such copper or aluminum outer sheaths would be 99.95% pure minimum, and 99.75% pure minimum, respectively (for example, copper alloy 102, and aluminum alloy 1060 or 1175; from *Standards Handbook*, "Copper.Brass.-Bronze-Wrought Mill Products", Copper Development Association, p. 11, and *Aluminum Standards and Data* 1979, The Aluminum Association, p. 15, respectively).

In U.S. Pat. No. 4,971,944 (Charles et al.), an attempt was made to prevent oxygen loss during sintering, yet still allow close interparticle contact, by electroless deposition of Au from a solution of gold chloride, and organic solvent on superconducting oxide.

What is needed however, is a superconducting composite that would optimize properties of ductility, interparticle contact, and minimum oxygen loss, and provide a safeguard in case of reversion to normal (non-superconducting) activity. It is the main object of this invention to provide such a composite.

SUMMARY OF THE INVENTION

Accordingly, the invention resides in a composite comprising a metal sheath, containing a core characterized as having: (1) particles of gold coated alkaline earth metal-copper oxides selected from the group consisting of yttrium-alkaline earth metal-copper oxide, rare earth metal-alkaline earth metal-copper oxide, bismuth-alkaline earth metal-copper oxide, and thallium-alkaline earth metal-copper oxide, and (2) hyperconducting aluminum having a purity of at least 99.999%; where the gold coated alkaline earth metal-copper oxide particles are homogeneously disposed within a hyperconducting aluminum matrix, and the matrix constitutes from 15 volume % to 70 volume % of the core.

Preferably, the sheath is a high strength, oxygen impermeable alloy of Al-Fe-Ce; the copper oxide is a yttrium-alkaline earth metal-copper oxide having a particle size of from 10 Angstrom Units (0.001 micrometer) to 10,000 Angstrom Units micrometer), a portion of which particles are preferably elongated; and the hyperconducting aluminum constitutes generally spherical particles having a particle size from 0.05 times to 0.5 times the particle size of the copper oxide particles. Throughout the specification the term "particle size" will mean the longest dimension of the particle. If the particle is substantially round particle size will equal diameter. If the particle is elongated, its particle size will equal its "length". Elongated particles are the preferred shape for the alkaline earth metal-copper oxide particles.

This ductile, high electrical conductivity composite can, at 4° K. to 85° K., operate in both the superconducting and hyperconducting mode, with electrons traveling through the copper oxide with essentially no resistance, and through the hyperconducting aluminum matrix with minimal resistance toward the next adjacent copper oxide particle. This would provide a series of superconducting—"fast conducting" conditions for electron travel. Ductility would be excellent, due to the lubristic interaction of the gold coating and the aluminum matrix material, allowing fine drawing of wire filaments, and problems of oxygen loss will be minimized since both the sheath and the gold coating on the copper oxide are oxygen and water vapor impermeable.

BRIEF DESCRIPTION OF THE DRAWINGS

In order that the invention will be more readily understood, the following description of preferred embodiments will now be described, by way of example only, with reference to the accompanying drawing which is one embodiment of a cross-section of the sheath and core material of the composite of this invention.

DESCRIPTION OF THE PREFERRED EMBODIMENTS

The ceramic oxide particles which are useful in the composite of this invention comprise alkaline earth metal-copper oxides selected from the group consisting of yttrium-containing, alkaline earth metal-copper oxides, such as $YBa_2Cu_3O_{7-x}$ ceramics; rare earth metal-containing, alkaline earth metal-copper oxides, such as $LaBa_2Cu_3O_{7-x}$ ceramics; and bismuth-containing, alkaline earth metal-copper oxides or thallium-containing, alkaline earth metal-copper oxides, such as (Bi or Tl)$_2$(Ba or Sr)$_2$ Ca$_{n-1}$ Cu$_n$O$_z$ ceramics, such as Bi-Sr-Ca-Cu-O or Tl-Ba-Ca-CuO, the latter group being described by P. Haldar et al., in *Science*, Vol. 241, September 1988, pp. 1198 to 1200, herein incorporated by reference.

The most preferred materials are the 1:2:3 ceramic oxides, usually characterized as $YBa_2Cu_3O_{7-x}$. The alkaline earth metal-copper oxide based ceramic will be chemically formed from appropriate amounts of constituent oxides and treated by heat or the like to provide optimized superconducting properties, as is well known in the art. The approximate particle size of these copper oxide materials will be from 10 Angstrom Units (0.001 micrometer) to 10,000 Angstrom Units (1 micrometer), preferably from 10 Angstrom Units to 1,000 Angstrom Units (0.1 micrometer). These particles will preferably be of an elongated shape with a ratio of short dimension: long dimension between 1:2 to 1:100, preferably between 1:5 and 1:50. Inclusion of these elongated particles provides a lined-up or aligned particulate configuration lengthwise along the length of the composite conductor, maximizing conduction. A mixture of spherical and elongated particles can also be used.

The ceramic oxide particles will be coated, preferably by the electroless process of Charles et al. described previously. In this process, gold chloride would be added to at least one organic component acting as solvent and reducing agent for the gold chloride, in a liquid environment non-reactive to the subsequently added ceramic oxide particles, to provide a gold solution. In instances where bismuth or thallium-containing, alkaline earth-copper oxide ceramic particles are used, water may be tolerated in the liquid. Then, the ceramic oxide particles would be added to the gold solution, to provide a suspension of the ceramic oxide particles.

When yttrium-containing 1:2:3 ceramic oxides are used, the gold chloride must be dissolved in a non-aqueous environment and the gold chloride should be anhydrous i.e., $AuCl_3$, rather than $AuCl_3.2H_2O$. Then, the suspension is heated at a temperature effective to form a layer of gold on the particles, such as from 30° C. to 100° C. with stirring. Initial coating will be over 2 Angstrom Units thick and can be varied depending on the particle size. For a particle size of 1,000 Angstrom Units, a 20 Angstrom Unit coating would be sufficient. The coating thickness will be reduced by $\frac{1}{2}$ to $\frac{1}{3}$ after the coated particles are pressed into core pellets.

The hyperconducting aluminum used is defined as being 99.999% pure as a minimum, having an electrical resistivity at 20° K. and below of less than about $2 \times 10^{-9}$ $\Omega$-cm, for example, $1 \times 10^{-9}$ $\Omega$-cm, a very high (1,000 to 5,000) Residual Resistivity Ratio (ratio of bulk resistivity at room temperature to that at 4° K.), and a high Debye temperature. The Resistivity of 99.9% pure aluminum at 4.2° K. to 20° K is from about $1 \times 10^{-7}$ $\Omega$-cm to $2 \times 10^{-8}$ $\Omega$-cm.

Hyperconductors are part of the class of conductors usually referred to as cryoresistors. It appears appropriate to use the term hyperconductor here, since it denotes a material somewhat intermediate between a "normal conductor" and a "superconductor". A high Residual Resistivity Ratio requires an extremely high-purity metal, 99.999% or higher. Thus, hyperconductors will not be simple, low-cost materials. Also, a high Residual Resistivity Ratio usually means the metal will be a non-transition metal, or at least a non-ferro or strongly para-magnetic metal.

Hyperconductors have extremely low resistance only at low "cryogenic" temperatures. A hyperconductor does have some resistivity even at absolute zero. The Debye temperature determines the rate at which the resistivity increases with temperature. The resistivity of metals with low Debye temperatures increases rapidly with temperature, whereas those with high Debye temperatures increase much more gradually. This is the reason a high Debye temperature is specified for hyperconductors. Aluminum hyperconductor material is considered a "ductile", hard hyperconductor, and has a Debye temperature of 428° K. and a Residual Resistivity at 4° K. of 0.0001 $\Omega$-cm. Such a material, while expensive, is commercially available in powder and wire form. As a comparison. Resistivity values of hyperconducting Al at 99 999% purity are $2 \times 10^{-9}$ $\Omega$-cm at 20.4° K., while Resistivity of Al at 99.7% purity are $9 \times 10^{-8}$ $\Omega$-cm at 20.4° K., a factor of about 45, and Resistivity of Al at 99.99% purity is $8 \times 10^{-9}$ $\Omega$-cm, a factor of 4.

The aluminum hyperconductor material would form a skeletal matrix around the coated copper oxide particles and constitute from 15 volume % to 70 volume % of the core. The hyperconducting aluminum could be intimately mixed with the coated copper oxide particles and the blend compacted into pellets, in which case, the particle size of the aluminum hyperconductor particles would be from 0.05 times to 0.5 times the particle size of the uncoated copper oxide particles. The drawing shows such a blend 10 as a pressed pellet in form disposed between a metallic sheath 12. The copper oxide particles 14, with their gold coating 16, shown here of a mixture of generally spherical and irregular elongated form, would be randomly oriented before wire drawing but would be oriented length wise along the A—A axis after drawing, as shown by elongated particles 18 and 20, which have a ratio of short dimension:long dimension of about 1:10. The skeletal matrix of hyperconducting aluminum particles 22 is shown, essentially encapsulating and isolating the substantially discrete, coated copper oxide particles 14. In another embodiment, the gold coated copper oxide particles could be pressed into a porous pellet and the pellet infiltrated by well known techniques with molten hyperconducting aluminum. The hyperconducting aluminum would still form a skeletal matrix.

The gold coated copper oxide-aluminum hyperconductor pressed pellets could then be loaded into an aluminum alloy sheath. The sheath would be sealed and the sealed sheath processed into wire by one of many well known techniques. Preferably, the sheath would be tubular or in flat sheet form and would be high strength and oxygen impermeable. Any standard, high strength aluminum alloy with a diffusion barrier could be used, for example, an alloy of Al-Fe-Ce, with 85 wt. % to 95 wt. % Al, or an alloy of Al-Mg-Si, with 85 wt. % to 95 wt. % Al, with a diffusion barrier, such as Au.

Some high-temperature superconducting elements could be developed in columnar form with preferred conduction characteristics along the column. Process means, such as drawing to reduce cross-section, could be used to align gold coated, elongated, copper oxide particles in the preferred current conduction direction, which is in the current direction along the length of the conductor. Conductors of this kind could be developed in fine filaments, and then be twisted and/or transposed into a multi-filamentary conductor, where the filaments would be insulated from each other.

As an Example, powdered, preformed $YBa_2Cu_3O_{7-x}$ (1:2:3 ceramic oxide) or $Bi_2Sr_2CaCu_2O_x$, of particle diameter less than 10,000 Angstrom Units (1 micrometer), where half the particles had lengths about 10 times their thicknesses, could be suspended in 100 ml of absolute ethyl alcohol by rapid stirring. One tenth of a gram of solid $AuCl_3$ could be dissolved in 10 ml of absolute ethyl alcohol to provide a gold solution. The resulting gold solution could be added to the stirred oxide suspension with stirring at a temperature of about 60° C.

Then, two grams of the reducing agent L-ascorbic acid could be added, as a solid, to insure complete reduction of $AuCl_3$. After a few minutes more of stirring, the mixture could be cooled to room temperature. This would provide a fine gold plating on the ceramic particulate matter. The coated copper oxide ceramic could be filtered off on a sintered glass crucible, washed separately with anhydrous ethyl alcohol, and finally dried in a vacuum desiccator for about 16 hours.

Hyperconducting aluminum metal, such as, for example that sold commercially under the tradename KRYAL could be used in generally spherical particle form, having 1/10th the particle size of the copper oxide, and could be added to the coated copper oxide to provide a blend of 40 volume % copper oxide and 60 volume % hyperconducting aluminum particles. Much more hyperconducting aluminum would be present than copper oxide, so that when the blend was pressed into cylindrical pellets, at approximately 211.5 kg/cm$^3$ (3,000 psi), the hyperconducting aluminum would form a skeletal matrix around the spherical and elongated mix of copper oxide particles, as shown in the drawing. The cylindrical pellets could then be placed, for example, in a 0.5 cm diameter, 86 wt. % Al-8 wt. % Fe-6 wt. % Ce tube, which could be sealed at each end by welding. The loaded tube could be cold drawn several times to reduce its cross-section, lining-up elongated copper oxide particles as shown in the drawing.

We claim:

1. A composite comprising a metallic sheath, containing a core consisting of:
   (1) particles of gold coated alkaline earth metal-copper oxides selected from the group consisting of yttrium-alkaline earth metal-copper oxide; rare earth metal-alkaline earth metal-copper oxide; bismuth-alkaline earth metal-copper oxide; and thallium-alkaline earth metal-copper oxide, and
   (2) hyperconducting aluminum particles having a purity of at least 99.999% and an electrical resistivity at 20° K. and below of less than $2 \times 10^{-9}$ Ω-cm; where the gold coated alkaline earth metal-copper oxide particles are homogeneously disposed within a hyperconducting aluminum matrix and are essentially encapsulated and isolated from each other by the hyperconducting aluminum, where the gold coating contacts aluminum particles, and where the copper oxides of the core have a particle size of from 10 Angstrom Units to 10,000 Angstrom Units, and the hyperconducting aluminum constitutes particles having a particle size from 0.05 time to 0.5 times the particle size of the copper oxide particles, and the matrix constitutes from 15 volume % to 70 volume % of the core.

2. The composite of claim 1, wherein the metallic sheath is aluminum alloy.

3. The composite of claim 1, where the sheath is oxygen impermeable and the copper oxide is a yttrium-alkaline earth metal-copper oxide.

4. The composite of claim 1, where the copper oxide particles contain elongated particles with a ratio of short dimension:long dimension between 1:2, and 1:100.

5. The composite of claim 1, where the sheath and core are tubular.

6. The composite of claim 1, where the gold coating on the copper oxide particles of the core have a thickness over 2 Angstrom Units.

7. The composite of claim 1, where the copper oxide is yttrium barium copper oxide and the composite can operate in the superconducting and hyperconducting mode at temperatures from 20° K. to 85° K.

8. The composite of claim 4, where the elongated particles are aligned lengthwise along the length of the composite conductor.

9. A plurality of the composites of claim 1, in filament form and twisted into a multi-filamentary conductor.

* * * * *